United States Patent
Cha et al.

(10) Patent No.: US 8,143,685 B2
(45) Date of Patent: Mar. 27, 2012

(54) IMAGE SENSOR HAVING NANODOT

(75) Inventors: Dae-kil Cha, Seoul (KR); Young-gu Jin, Hwaseong-si (KR); Bok-ki Min, Suwon-si (KR); Yoon-dong Park, Yongin-si (KR)

(73) Assignee: Samsung Electronics CP., Ltd., Suwon-Si (KR)

( * ) Notice: Subject to any disclaimer, the term of this patent is extended or adjusted under 35 U.S.C. 154(b) by 168 days.

(21) Appl. No.: 12/508,079

(22) Filed: Jul. 23, 2009

(65) Prior Publication Data

US 2010/0019296 A1 Jan. 28, 2010

(30) Foreign Application Priority Data

Jul. 24, 2008 (KR) .................. 10-2008-0072438

(51) Int. Cl.
*H01L 31/0232* (2006.01)
(52) U.S. Cl. .......... 257/432; 257/E27.131; 257/E31.079
(58) Field of Classification Search .................. 257/292, 257/432, E31.127, E31.079, 431, E27.131, 257/E27.135
See application file for complete search history.

(56) References Cited

U.S. PATENT DOCUMENTS

| | | | |
|---|---|---|---|
| 2006/0011956 A1* | 1/2006 | Chijiiwa et al. | 257/292 |
| 2006/0014329 A1* | 1/2006 | Park et al. | 438/142 |
| 2007/0187787 A1* | 8/2007 | Ackerson et al. | 257/428 |
| 2008/0079022 A1* | 4/2008 | Yamamoto et al. | 257/184 |

FOREIGN PATENT DOCUMENTS

| | | |
|---|---|---|
| JP | 2005-277311 | 10/2005 |
| KR | 1020020072659 A | 9/2002 |
| KR | 1020030056596 A | 7/2003 |

OTHER PUBLICATIONS

Konchenko et al., "Quantum confinement observed in Ge nanodots on an oxide Si surface", 1006, vol. B73, pp. 113311-1-113311-4.*

* cited by examiner

*Primary Examiner* — Thomas L Dickey
*Assistant Examiner* — Nikolay Yushin
(74) *Attorney, Agent, or Firm* — F. Chau & Associates, LLC

(57) ABSTRACT

An image sensor includes a plurality of pixels disposed in an array, each pixel comprising a first region and a second region, the first region and the second region separated from each other in a semiconductor layer, and doped with impurities having different conductivities from each other, a photoelectric conversion region formed between the first and second regions, and at least one metal nanodot that focuses an incident light onto the photoelectric conversion region.

11 Claims, 5 Drawing Sheets

UNIT PIXEL

IMAGE SENSOR HAVING NANODOT

CROSS-REFERENCE TO RELATED APPLICATION

This application claims priority to Korean Patent Application No. 10-2008-0072438, filed on Jul. 24, 2008, the disclosure of which is incorporated herein in its entirety by reference.

BACKGROUND OF THE INVENTION

1. Technical Field

The present disclosure relates to an image sensor, and more particularly to an image sensor having a nanodot.

2. Discussion of the Related Art

A color image sensor is a photoelectric transducer that converts light into an electric signal. A conventional image sensor includes a plurality of unit pixels arranged in an array on a semiconductor substrate. Each unit pixel includes a photodiode and a plurality of transistors. The photodiode generates and stores photocharges by receiving external light, and the transistors output electrical signals according to the generated photocharges.

A complimentary metal oxide semiconductor (CMOS) image sensor includes a photodiode that receives and stores an optical signal, and a control device that controls or processes the optical signal to display an image. The control device can be formed using a CMOS forming method. Thus, the CMOS image sensor can be formed in a single chip together with various signal processing devices including the control device.

A unit pixel of the CMOS image sensor can be formed in a sub-micron size. Also, a plurality of pixels can be formed in sub-micron size image sensors. A conventional single sub-pixel region requires a first region for mounting conventional transistors for sending an intensity of light incident to the single sub-pixel region as a single analogue information and a second region for mounting a single analogue digital converter in a single column line.

A micro lens focuses light onto a photoelectric conversion region. However, focusing light onto a photoelectric conversion region using the micro lens is difficult when the photoelectric conversion region is sub-micron size.

SUMMARY OF THE INVENTION

In an exemplary embodiment of the present invention, a nanodot focuses light onto a sub-micron size photoelectric conversion region.

According to an exemplary embodiment of the present invention, an image sensor comprises a plurality of pixels disposed in an array, each pixel comprising a first region and a second region, the first region and the second region separated from each other in a semiconductor layer, and doped with impurities having different conductivities from each other, a photoelectric conversion region formed between the first and second regions, and at least one metal nanodot that focuses an incident light onto the photoelectric conversion region.

The metal nanodot can be disposed on an upper surface of the semiconductor layer.

The metal nanodot can be disposed in the semiconductor layer and: an upper surface of the metal nanodot is exposed.

The metal nanodot may comprise at least one of Ag, Au, Al, Pt, Ni, Ti, or Cu.

The metal nanodot may have a size of about 10 nm to about 100 nm.

According to an exemplary embodiment of the present invention, an image sensor comprises a plurality of pixels disposed in an array, each pixel comprising a plurality of sub-pixels, and each sub-pixel comprising a plurality of floating body transistors that receive light, wherein each floating body transistor comprises a back gate, a gate insulating layer disposed on the back gate, a source region and a drain region disposed on the gate insulating layer, a semiconductor layer comprising a floating body region disposed between the source region and the drain region, and at least one metal nanodot focusing the light onto the floating body region.

The floating body region may generate electron-hole pairs in response to the light.

The electrons can be discharged through the source region or the drain region, and the holes are accumulated in the floating body region.

The image sensor may further comprise a plurality of gate lines connecting the back gates, a plurality of row lines connecting the drain regions, and a plurality of column lines connecting the source regions, wherein the column lines are perpendicularly formed with respect to the gate lines and the row lines.

The first current state and the second current state may be measured from a current in the column lines and the measured current in the first current state is greater than the measured current in the second current state.

The floating body transistors may have a width of about 50 nm to about 500 nm.

The metal nanodot can have a size of a half of the floating body transistor or less.

A width of the metal nanodot can be in the range of about 10 nm to about 100 nm.

The metal nanodot can be disposed on an upper surface of the semiconductor layer.

The metal nanodot can be disposed in the semiconductor layer and an upper surface of the metal nanodot is exposed.

The metal nanodot may comprise at least one of Ag, Au, Al, Pt, Ni, Ti, or Cu.

According to an exemplary embodiment of the present invention, an image sensor comprises a semiconductor substrate, a first region and a second region formed in the semiconductor substrate, the first and second regions having different conductivity type impurities, a photoelectric conversion region formed between the first and second regions, a lens focusing incident light, the lens formed above the photoelectric conversion region, a color filter formed between the lens and the photoelectric conversion region, and at least one metal nanodot focusing the incident light onto the photoelectric conversion region.

BRIEF DESCRIPTION OF THE DRAWINGS

Exemplary embodiments of the present invention can be understood in more detail from the following descriptions taken in conjunction with the accompanying drawings, in which.

DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

An image sensor according to an exemplary embodiment of the present invention includes a plurality of unit pixels arranged in an array. Each unit pixel includes a plurality of sub-pixels that respectively detect visible light having a predetermined wavelength. The sub-pixels may be a red pixel R, a green pixel G, or a blue pixel B. Color filters may be disposed on the sub-pixels. Each color filter selectively transmits light to be detected. A micro lens that focuses light may be disposed on the color filters.

Figure 1:
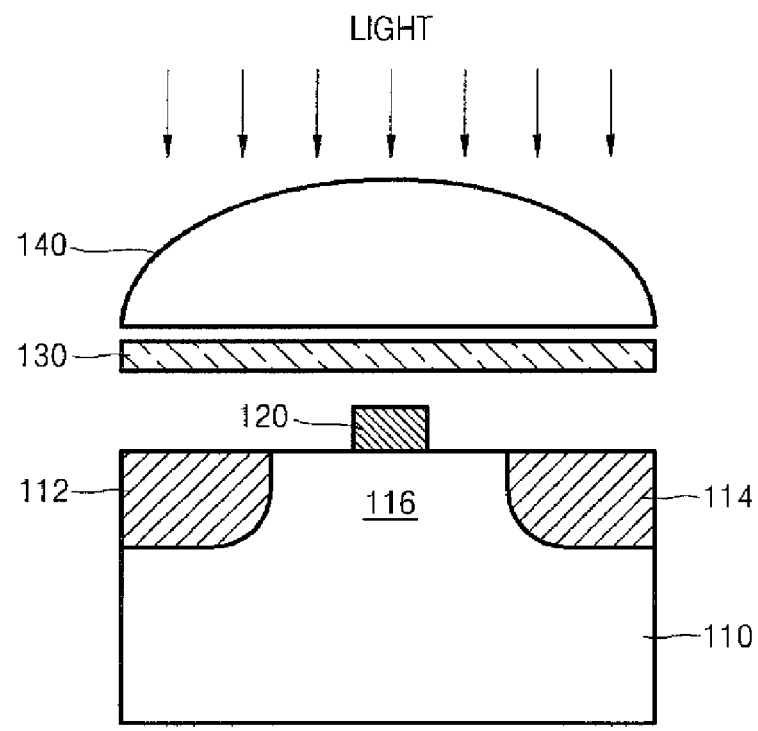
FIG. 1 is a cross-sectional view of a sub-pixel of an image sensor according to an exemplary embodiment of the present invention.

FIG. 1 is a cross-sectional view of a sub-pixel of an image sensor according to an exemplary embodiment of the present invention.

Referring to FIG. 1, a first region 112 and a second region 114 are separately formed in a semiconductor substrate 110 comprising, for example, silicon. The first region 112 and the second region 114 are doped with impurities having different conductivity types. The first region 112 may be doped with an n-type impurity and the second region 114 may be doped with a p-type impurity. A region between the first and second regions 112 and 114 is a photoelectric conversion region 116. The photoelectric conversion region 116 may be an undoped intrinsic region or a region doped with the n-type or p-type impurity with a concentration lower than those of the first and second regions 112 and 114. The photoelectric conversion region 116 generates electron-hole pairs in response to received light. The electrons and the holes generated in the photoelectric conversion region 116 respectively move to the second region 114 and the first region 112.

A metal nanodot 120 is formed on the photoelectric conversion region 116. The metal nanodot 120 may comprise, for example, Ag, Au, Al, Pt, Ni, Ti, or Cu. The metal nanodot 120 may have a size of about 10 nm to about 100 nm.

A color filter 130 is disposed on the photoelectric conversion region 116. A micro-lens 140 may be disposed on the color filter 130. The color filter 130 may be one of a red filter, a green filter, or a blue filter. The sub-pixel may be one of a red pixel R, a green pixel G, or a blue pixel B according to the color filter 130.

A plurality of transistors are formed under the photoelectric conversion region is 116, the first region 112, and the second region 114. The transistors are signal devices that transform generated charges. For example, the amount of electrons generated from the photoelectric conversion region 116 is transformed to electrical signals. The signal devices may comprise three or four transistors.

When light is projected on the image sensor, the light is focused by the micro lens 140. The light having a predetermined wavelength passes through the color filter 130. Upon passing the color filter 130, the filtered light is scattered by the metal nanodot 120, and a near field is formed by the oscillation of free electrons of the metal nanodot 120. Thus, the light is focused around the metal nanodot 120. As such, the metal nanodot 120 secondarily focuses the light.

The metal nanodot 120 may be formed by patterning a metal thin film in a rectangular shape after forming the metal thin film on the semiconductor substrate 110.

The metal nanodot 120 re-focuses the light around the metal nanodot 120 because the light cannot be focused to a sub-micron size by the micro-lens 140 due to the diffraction limit of the micro-lens 140. Thus, the light is focused around the metal nanodot 120. In an exemplary embodiment, the light can be focused on the photoelectric conversion region 116 by increasing the number of metal nanodots 120 having a reduced size on the photoelectric conversion region 116.

Figure 2:
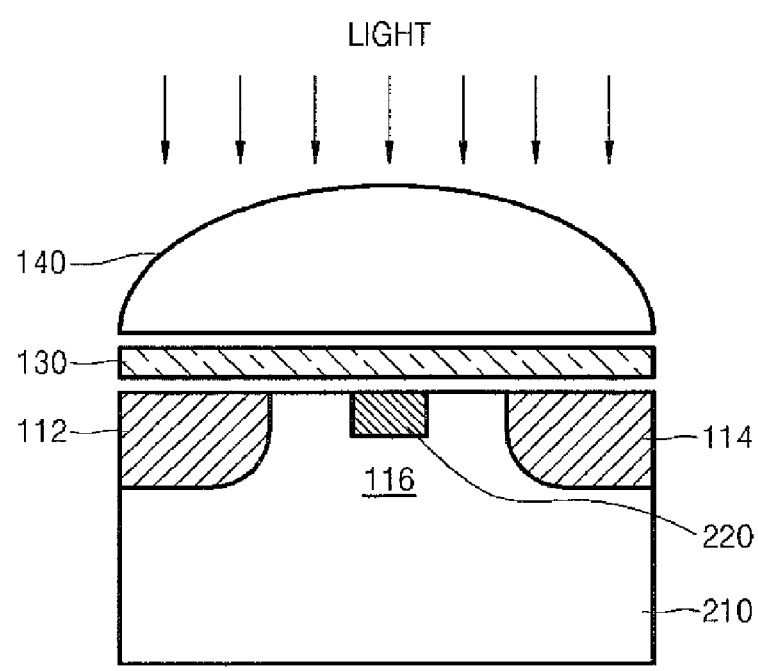
FIG. 2 is a cross-sectional view of a sub-pixel of an image sensor according to an exemplary embodiment of the present invention.

FIG. 2 is a cross-sectional view of a sub-pixel of an image sensor according to an exemplary embodiment of the present invention. Referring to FIG. 2, a metal nanodot 220 is formed in the photoelectric conversion region 116. An upper surface of the metal nanodot 220 is exposed. The metal nanodot 220 may comprise, for example, Ag, Au, Al, Pt, Ni, Ti, or Cu. The metal nanodot 220 may have a size of about 10 nm to about 100 nm.

When light is projected on the image sensor, the light is focused by the micro-lens 140. The light having a predetermined wavelength passes through the color filter 130. Upon passing the color filter 130, the filtered light is scattered by the metal nanodot 220 and is focused around the metal nanodot 220.

The metal nanodot 220 may be formed by forming a hole with a predetermined depth in the semiconductor substrate 210 and forming a thin metal film that fills the hole. The thin metal film can be planarized using a chemical mechanical polishing (CMP) method. Alternatively, the thin metal film can be planarized when the thin metal film is dry-etched.

The metal nanodot 220 re-focuses the light around the metal nanodot 220 because the light cannot be focused to a sub-micron size by the micro-lens 140 due to the diffraction limit of the micro-lens 140. Thus, the light is focused around the metal nanodot 220. In an exemplary embodiment, the light can be focused on the photoelectric conversion region 116 by increasing the number of metal nanodots 220 formed in the photoelectric conversion region 116.

Figure 3:
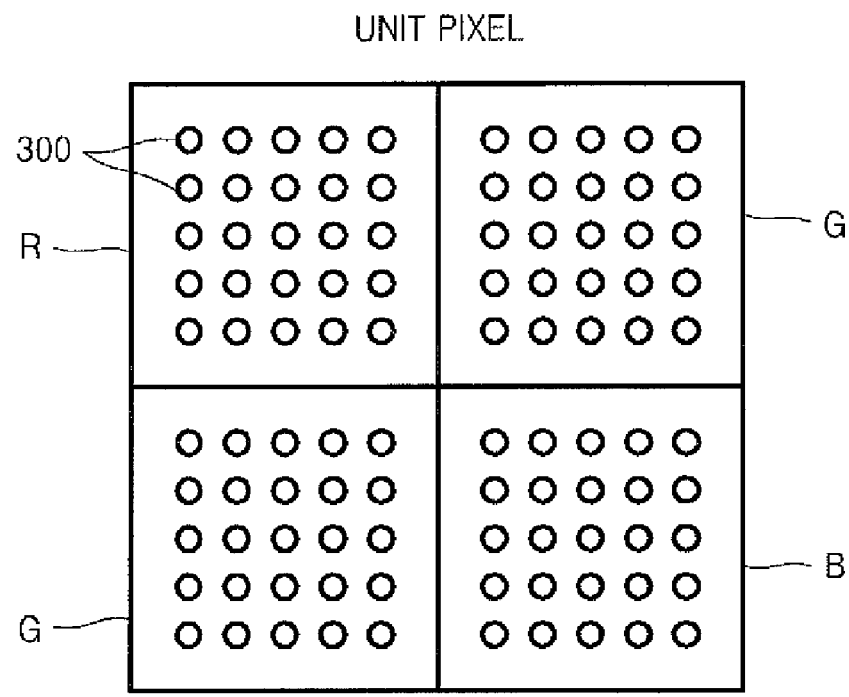
FIG. 3 is a plan view of an image sensor according to an exemplary embodiment of the present invention.

FIG. 3 is a plan view of a unit pixel of an image sensor according to an exemplary embodiment of the present invention.

The image sensor includes a plurality of unit pixels arranged in an array. The unit pixel includes a plurality of sub-pixels that respectively detect visible light of different wavelengths. The sub-pixels may be a red pixel R, a green pixel G, and a blue pixel B. Color filters may be disposed on the sub-pixels. Each color filter selectively transmits light to be detected. A micro lens that focuses light may be disposed on the color filters.

A plurality of floating body transistors 300 and wires that connect the floating body transistors 300 in an array are formed in each of the sub-pixels R, G, and B. The floating body transistors 300 may have a size of about 50 nm to about 500 nm. The floating body transistors 300 provide binary information of whether the light is projected or not onto the floating body transistors 300.

Figure 4:
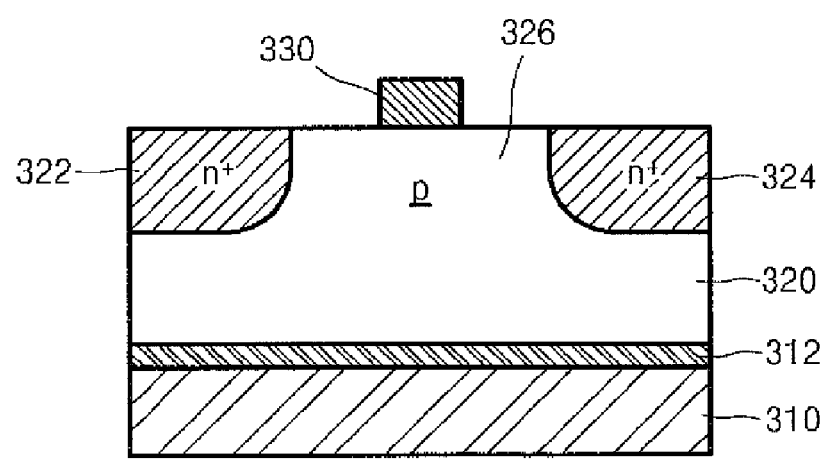
FIG. 4 is a cross-sectional view of an image sensor having a floating body transistor according to an exemplary embodiment of the present invention.

FIG. 4 is a cross-sectional view of an image sensor having a floating body transistor according to an exemplary embodiment of the present invention.

Referring to FIG. 4, an insulating layer 312 is formed on a back gate 310, and a semiconductor layer 320 is formed on the insulating layer 312. The back gate 310 may be a silicon layer, and the insulating layer 312 is a gate insulating layer and may comprise silicon oxide. The semiconductor layer 320 may be a p-type silicon layer. A source region 322 and a drain region 324 both doped with an n-type impurity are separately formed in the p-type silicon layer 320. A region between the source region 322 and the drain region 324 is a floating body region 326.

A metal nanodot 330 is formed on the floating body region 326 using, for example, Ag, Au, Al, Pt, Ni, Ti, or Cu. The size of the metal nanodot 330 may be smaller than a half of the floating body transistor 300. The size of the metal nanodot 330 may be about 10 nm to about 100 nm. When the metal nanodot 330 has a size larger than a half of the floating body transistor 300, an amount of light blocked by the metal nanodot 330 is large. As such, the sensitivity of the image sensor may be reduced.

Because the floating body transistors 300 are formed in a sub-micron size, it is difficult to focus the light onto the floating body transistors 300. The metal nanodot 330 can be used to focus the light onto the floating body transistors 300, thereby increasing the light detection capability.

A method of recording information on the floating body transistors 300 is described according to an exemplary embodiment of the present invention.

When a predetermined negative voltage in a range of, for example, about −1V to about −2V is applied to the back gate 310 of the floating body transistors 300, a charge storage space is formed in the floating body region 326. An electron moving path is formed by applying a positive voltage, for example, about 0.5V to the drain region 324.

Then, light is projected onto the image sensor. The light having a predetermined wavelength passing the micro-lens 140 and the color filter 130 is projected onto the floating body region 326. Thus, electron-hole pairs are generated in the floating body region 326. Electrons, while moving to the drain region 324, form a plurality of electron-hole pairs in the floating body region 326 due to an avalanche phenomenon caused by a strong field formed by a gate voltage.

Electrons are discharged through the drain region 324, and holes are accumulated in the floating body region 326. The accumulated holes reduce energy barrier. Accordingly, the floating body transistors 300 are turned into a state in which a current can freely flow. If this state is referred to as a "1" state, and the state before light projection is referred to as a "0" state, the floating body transistors 300 can provide binary information according to whether the light is projected on the floating body transistors 300 or not.

A positive voltage is applied to the drain region 324 to discharge the electrons to the drain region 324 that has a lower potential. The application of the positive voltage to the drain region 324 may be performed after the light projection. That is, after projecting light in a state in which the potential of the source region 322 and the potential of the drain region 324 are equal, electrons can be discharged by reducing the potential of the drain region 324.

Although a small amount of light is projected, photons store a large amount of holes in the floating body region 326 due to an avalanche phenomenon. Thus, an optical sensor with a high sensitivity can be acquired according to an exemplary embodiment of the present invention. Accordingly, when four hundred of the floating body transistors 300 having a size of about 100 nm are formed in a substantially narrow region having a dimension of about 2 μm, four hundred optical sensors are formed in a single sub-pixel. Thus, an optical intensity having a range of 0 to 400 can be detected, thereby increasing the sensitivity of optical detection.

According to an exemplary embodiment of the present invention, a reduced-size CMOS sensor can be achieved because the first region for mounting a plurality of transistors and a second region for mounting a single analogue-digital converter in a single column line can be minimized or eliminated.

Figure 5:
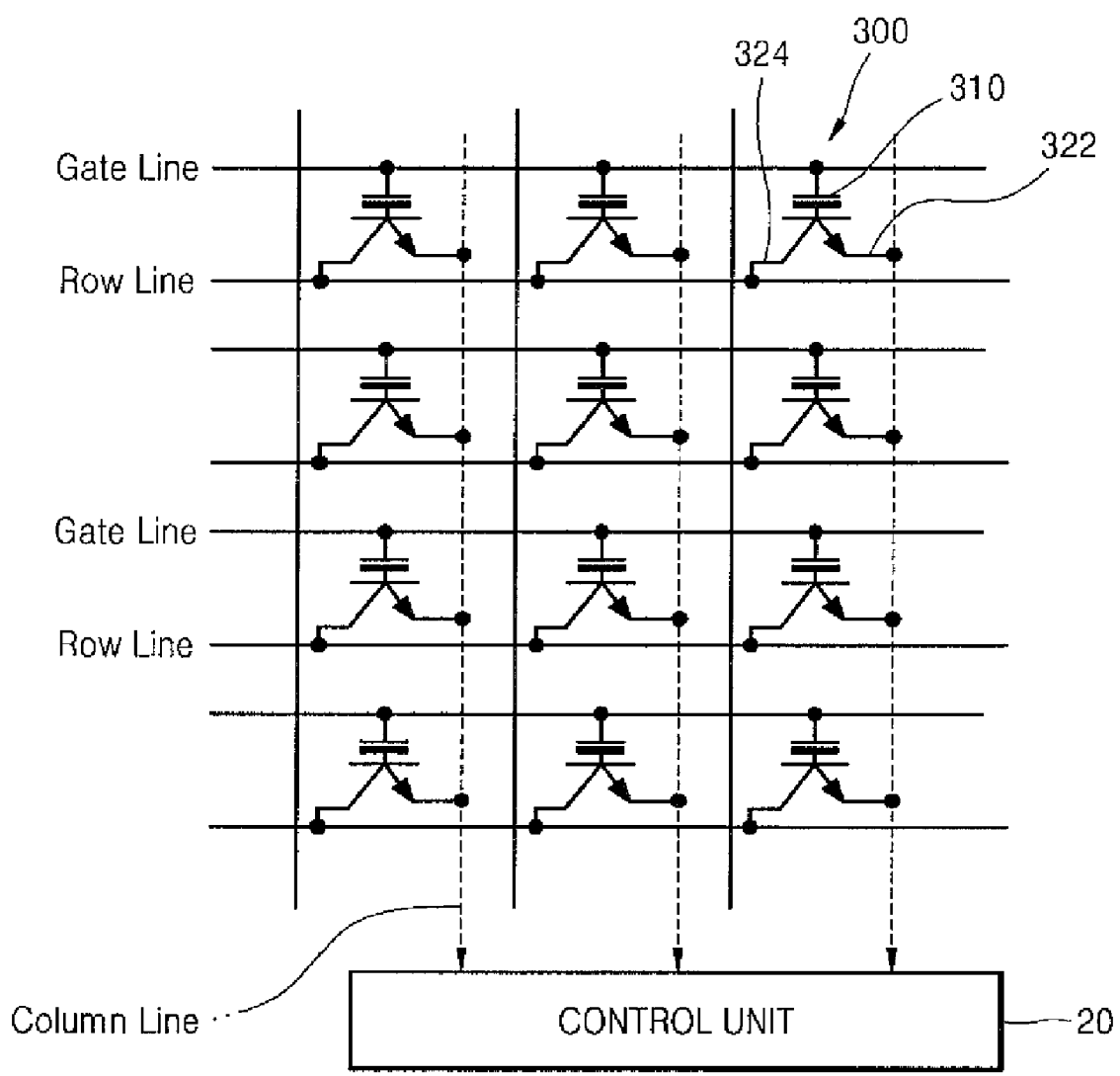
FIG. 5 shows an array of sub-pixels of an image sensor according to an exemplary embodiment of the present invention.

FIG. 5 shows a cell array of a sub-pixel of an image sensor according to an exemplary embodiment of the present invention.

Referring to FIG. 5, a sub-pixel includes a plurality of cells having the floating body transistors 300 arranged in an array. A row line is connected to the drain regions 324 of the floating body transistors 300 that belong to a single row, and the source regions 322 are connected to a column line. A gate line is connected to the back gates 310 and is parallel to the row lines. Accordingly, the column lines can address the cells having the floating body transistor 300 that cross the row line. Also, the column line can address a cell with the gate line.

A method of reading image information in each cell in an image sensor according to an exemplary embodiment of the present invention is described.

A single row line is selected and a predetermined voltage of, for example, 0.1V is applied to the selected row line. A column line through which current flows is detected by scanning the column lines. When current flows in the column line, a cell where the row line and the column line cross can be read as "1" state, and cells where a current does not flow can be read as "0" state.

When this process is repeated, information with respect to all cells that belong to the sub-pixel can be read.

A control unit 20 connected to the column lines yields a number in which inputted information of "1" is added, and the number is divided by the total number of the cells to calculate the intensity of light at a corresponding sub-pixel.

Accordingly, the image sensor according to an exemplary embodiment of the present invention obtains the intensity of light as a digital information from the sub-pixel. As such, an analogue-digital converter is not needed, and there is no noise caused by transistors and the analogue-digital converter. An accurate optical intensity can be measured according to an exemplary embodiment of the present invention, thereby increasing the sensitivity of the image sensor.

Figure 6:
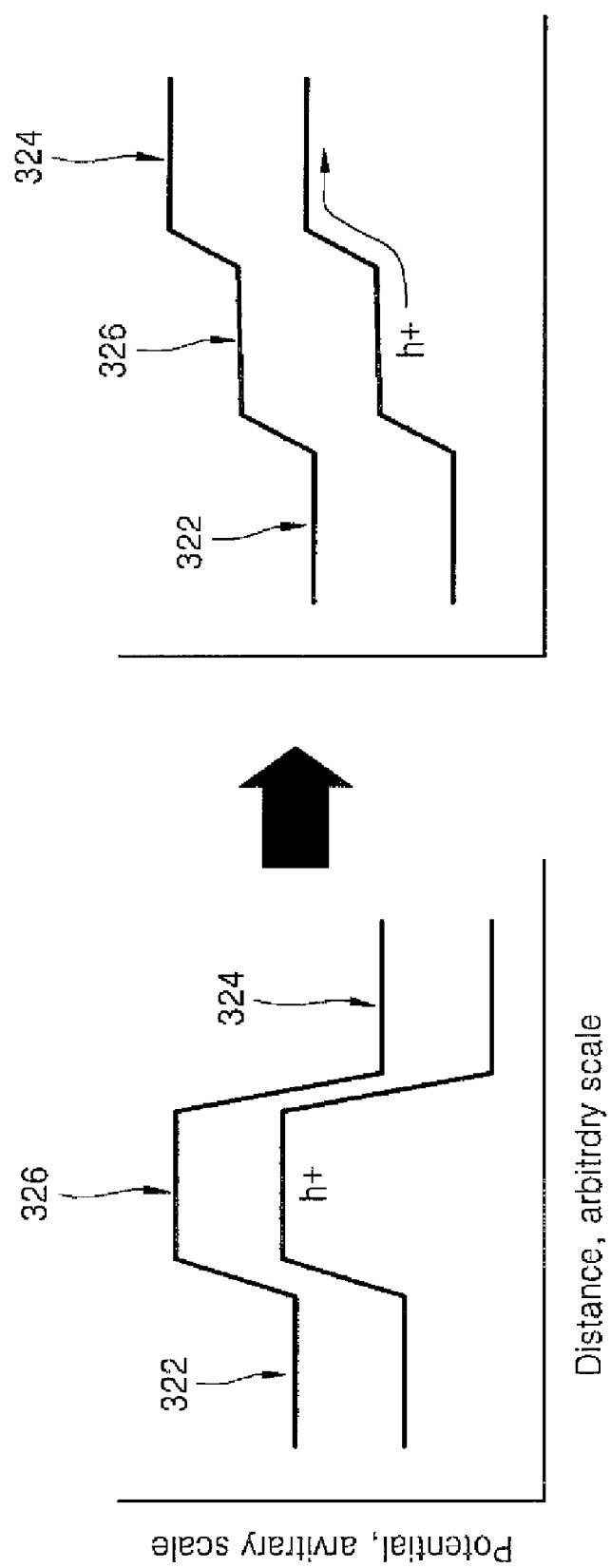
FIG. 6 is a band diagram showing a method of removing recorded information in a floating body transistor according to an exemplary embodiment of the present invention.

FIG. 6 is a band diagram showing a method of removing recorded information in a floating body transistor according to an exemplary embodiment of the present invention.

Referring to FIG. 6, when holes are accumulated in the floating body region 326, and the potential of the drain region 324 is increased greater than that of the floating body region 326 by applying a predetermined negative voltage to the drain region 324, the holes stored in the floating body region 326 are discharged through the drain region 324. The floating body region 326 can be returned to a "0" state by applying a positive voltage to the drain region 324.

To remove recorded information, a negative voltage may be applied to the source region 322 instead of the drain region 324.

Alternatively, to remove recorded information, the potential of the floating body region 326 may be positioned between potentials of the source region 322 and the drain region 324 by further applying a predetermined positive voltage to the back gate 310 in addition to applying a negative voltage to the source region 322 or the drain region 324.

A conventional CMOS image sensor outputs received light as a voltage, and the output voltage is read in a digital data using an analogue-digital converter. To measure charges generated in response to light, three or four transistors can be used in the conventional CMOS image sensor.

In an image sensor according to an exemplary embodiment of the present invention, a single floating body transistor 300 receives light and outputs a single digital signal. Thus, the image sensor according to an exemplary embodiment of the present invention does not require a conventional analogue-digital converter and a plurality of transistors for processing signals.

Figure 7:
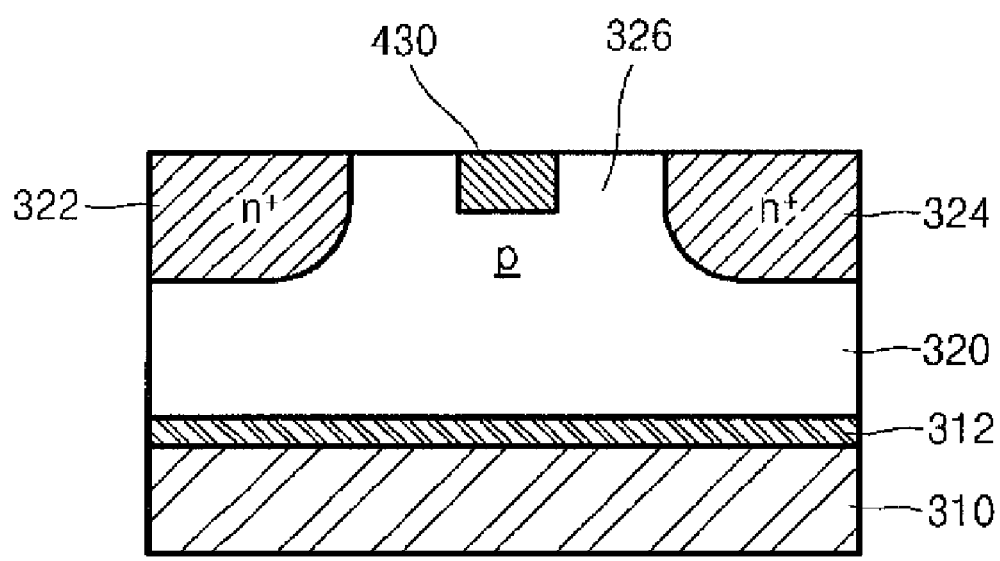
FIG. 7 is a cross-sectional view of an image sensor according to an exemplary embodiment of the present invention.

FIG. 7 is a cross-sectional view of an image sensor according to an exemplary embodiment of the present invention.

Referring to FIG. 7, a metal nanodot 430 is formed in the floating body region 326. An upper surface of the metal nanodot 430 is exposed. The substrate 320 may be a silicon layer. The metal nanodot 430 may comprise, for example, Ag, Au, Al, Pt, Ni, Ti, or Cu. In an exemplary embodiment, the metal nanodot 430 may be substantially identical to the metal nanodot 330 of FIG. 4.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. An image sensor, comprising:
    a plurality of pixels disposed in an array, each pixel comprising a plurality of sub-pixels, and each sub-pixel comprising a plurality of floating body transistors that receive light,
    wherein each floating body transistor comprises:
        a back gate;
        a gate insulating layer disposed on the back gate;
        a source region and a drain region disposed on the gate insulating layer;
        a semiconductor layer comprising a floating body region disposed between the source region and the drain region; and
        at least one metal nanodot focusing the light onto the floating body region.

2. The image sensor of claim 1, wherein the floating body region generates electron-hole pairs in response to the light.

3. The image sensor of claim 2, wherein the electrons are discharged through the source region or the drain region, and the holes are accumulated in the floating body region.

4. The image sensor of claim 3, further comprising:
    a plurality of gate lines connecting the back gates;
    a plurality of row lines connecting the drain regions; and
    a plurality of column lines connecting the source regions,
    wherein the column lines are perpendicularly formed with respect to the gate lines and the row lines.

5. The image sensor of claim 4, wherein the first current state and the second current state are measured from a current in the column lines and the measured current in the first current state is greater than the measured current in the second current state.

6. The image sensor of claim 1, wherein the floating body transistors have a width of about 50 nm to about 500 nm.

7. The image sensor of claim 6, wherein the metal nanodot has a size of a half of the floating body transistor or less.

8. The image sensor of claim 7, wherein a width of the metal nanodot is in the range of about 10 nm to about 100 nm.

9. The image sensor of claim 1, wherein the metal nanodot is disposed on an upper surface of the semiconductor layer.

10. The image sensor of claim 1, wherein the metal nanodot is disposed in the semiconductor layer and an upper surface of the metal nanodot is exposed.

11. The image sensor of claim 1, wherein the metal nanodot comprises at least one of Ag, Au, Al, Pt, Ni, Ti, or Cu.

\* \* \* \* \*